United States Patent
Grynkewich et al.

(10) Patent No.: US 6,911,156 B2
(45) Date of Patent: Jun. 28, 2005

(54) METHODS FOR FABRICATING MRAM DEVICE STRUCTURES

(75) Inventors: Gregory W. Grynkewich, Gilbert, AZ (US); Brian R. Butcher, Gilbert, AZ (US); Mark A. Durlam, Chandler, AZ (US); Kelly Kyler, Mesa, AZ (US); Kenneth H. Smith, Chandler, AZ (US); Clarence J. Tracy, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 168 days.

(21) Appl. No.: 10/417,537

(22) Filed: Apr. 16, 2003

(65) Prior Publication Data

US 2004/0205958 A1 Oct. 21, 2004

(51) Int. Cl.[7] .............................................. H01L 21/00
(52) U.S. Cl. ........................... 216/22; 216/2; 216/41; 216/49; 216/47; 216/51; 438/3; 438/696; 438/700
(58) Field of Search .......................... 216/22, 41, 46, 216/47, 51; 438/3, 696, 700

(56) References Cited

U.S. PATENT DOCUMENTS

| | | | | |
|---|---|---|---|---|
| 4,470,873 A | * | 9/1984 | Nakamura | 216/22 |
| 5,804,458 A | * | 9/1998 | Tehrani et al. | 438/3 |
| 6,165,803 A | * | 12/2000 | Chen et al. | 438/3 |
| 6,365,419 B1 | * | 4/2002 | Durlam et al. | 438/3 |
| 6,485,989 B1 | | 11/2002 | Signorini | |
| 6,656,371 B2 | * | 12/2003 | Drewes | 216/22 |
| 6,771,533 B2 | * | 8/2004 | Witcraft et al. | 365/158 |
| 2003/0059958 A1 | * | 3/2003 | Drewes | 438/3 |
| 2003/0228711 A1 | * | 12/2003 | Nejad et al. | 438/3 |
| 2004/0063223 A1 | * | 4/2004 | Costrini et al. | 438/3 |
| 2004/0087039 A1 | * | 5/2004 | Gupta et al. | 438/3 |

* cited by examiner

Primary Examiner—Anita Alanko
(74) Attorney, Agent, or Firm—Ingrassia, Fisher & Lorenz, P.C.

(57) ABSTRACT

A method for fabricating a magnetic memory element structure comprises providing a dielectric layer having a conducting via. A first magnetic layer is formed overlying the dielectric layer and is in electrical communication with the conducting via. A non-magnetic layer and a second magnetic layer are formed overlying the first magnetic layer. A first conductive layer is deposited overlying the second magnetic layer and is patterned. A portion of the second magnetic layer is exposed and is transformed to form an inactive portion and an active portion. The active portion comprises a portion of a memory element and the inactive portion comprises an insulator. A sidewall spacer is formed about at least one sidewall of the first conductive layer and a masking tab is formed that overlies a portion of the memory element and extends to overlie at least a portion of the conducting via.

27 Claims, 6 Drawing Sheets

METHODS FOR FABRICATING MRAM DEVICE STRUCTURES

FIELD OF THE INVENTION

The present invention generally relates to magnetoelectronic devices, and more particularly relates to methods for fabricating magnetoresistive random access memory devices structures.

BACKGROUND OF THE INVENTION

Magnetoelectronics devices, spin electronics devices and spintronics devices are synonymous terms for devices that use the effects predominantly caused by electron spin. Magnetoelectronics effects are used in numerous information devices, and provide non-volatile, reliable, radiation resistant, and high-density data storage and retrieval. Magnetoresistive random access memory (MRAM) devices are well-known magnetoelectronics information devices.

One class of MRAM devices is composed of a plurality of arrays of memory elements known as magnetic tunnel junction (MTJ) elements. Each MTJ element comprises two magnetic layers separated by a non-magnetic layer. Magnetic vectors in one of the magnetic layers are magnetically fixed or pinned, while the magnetization direction of the other magnetic layer is free to switch between the same and opposite directions that are called "Parallel" and "Antiparallel" states. In response to Parallel and Antiparallel states, the MTJ element represents two different resistances. A detection of changes in resistance allows an MRAM device to provide information stored in the MTJ element. Typically, the MTJ element has conductive layers that are disposed adjacent the magnetic layers so that current may be applied to the magnetic layers to change the magnetic qualities of the MTJ element thereby altering its resistance.

MTJ elements are formed using patterning and etching techniques well-known and commonly used in the semiconductor industry. Typically, a blanket layer of a first conductive layer is deposited overlying a substrate, followed by deposition of the fixed or pinned magnetic layer, the non-magnetic layer, the free magnetic layer and the second conductive layer. However, when these layers are subsequently etched to form the MTJ element, shorting of the MTJ element may occur as a result of metallic particles from one or more of the metallic layers forming on the sides of the MTJ element.

Efforts have been ongoing to improve standard patterning and etching techniques to prevent shorting of MTJ elements that may be formed in an MRAM array. However, such efforts have included methods that use multiple masking and etching steps that consume valuable real estate in the MRAM device. Because an MRAM device may include millions of MTJ elements, such use of real estate in the formation of each MTJ element can result in a significant decrease in the density of the MRAM device.

Accordingly, it is desirable to provide improved methods for fabricating magnetic memory element structures that increases the yield of magnetic memory elements. In addition, it is desirable to provide methods for fabricating compact magnetic memory element structures. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
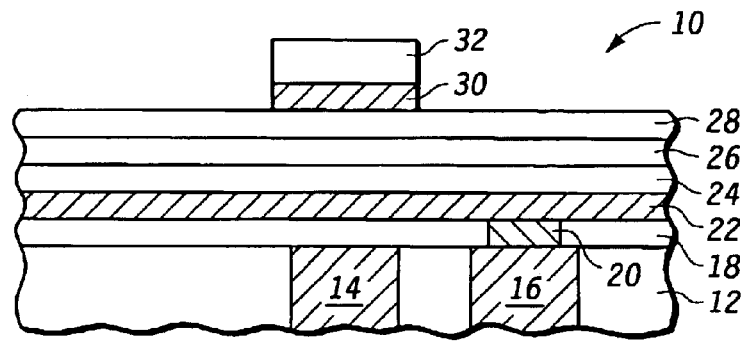
FIGS. 1–5 illustrate schematically, in cross section, a method for fabricating a magnetic memory element structure in accordance with an exemplary embodiment of the present invention.

Turning now to the figures, FIGS. 1–5 illustrate a method in accordance with one exemplary embodiment of the present invention for fabricating a magnetic memory element structure of an MRAM device. FIG. 1 is a cross-sectional view of partially fabricated magnetic memory element structure 10 of an MRAM device. The method begins by providing a substrate 12 having a conductor 16 and a digit line 14 formed therein. Substrate 12 can be formed of any suitable dielectric material, such as, for example, silicon dioxide. While not shown, conductor 16 typically is electrically connected, such as by a plug conductor or a series of conductors in an interconnect stack, to a transistor formed in a semiconductor substrate, such as a silicon substrate.

Conductor 16 typically is formed during the deposition of a metallization layer that also forms digit line 14. Digit line 14 is positioned within substrate 12 so as to be magnetically coupled to a subsequently formed magnetic tunnel junction (MTJ) element, described in more detail below. The metallization layer that forms conductor 16 and digit line 14 may be fabricated using well known CMOS processes, such as damascene processing or subtractive pattern processing such as etching. Conductor 16 and digit line 14 may comprise any suitable conductive material, such as aluminum (Al), aluminum alloys, copper (Cu) and copper alloys and may include barrier materials such as, for example, tantalum (Ta), tantalum nitride (TaN), titanium (Ti), titanium nitride (TiN), or titanium tungsten (TiW).

A dielectric layer 18 is deposited over digit line 14, conductor 16, and substrate 12 and is etched to make a window within which a conducting via 20 is formed. As used herein, the term "layer" means one layer or a combination of sub-layers. Conducting via 20 overlies and is electrically coupled to conductor 16. A first conductive layer 22 then is deposited overlying dielectric layer 18 and conducting via 20. In an alternative exemplary embodiment of the present invention, after dielectric layer 18 is etched to form a window for conducting via 20, a suitable conducting material may be deposited to form conducting via 20 and a first conductive layer 22. First conductive layer 22 and conductive via 20 can be formed of any suitable electrically conductive materials. Preferably, first conductive layer 22 and conductive via 20 are formed of tantalum (Ta), tungsten (W), titanium (Ti), aluminum (Al), tantalum nitride (TaN) or combinations or alloys thereof. More preferably, first conductive layer 22 and conductive via 20 are formed of tantalum.

A first magnetic layer 24, a tunnel barrier layer 26, and a second magnetic layer 28 are deposited overlying first conductive layer using methods such as, for example, physical vapor deposition (PVD), ion beam deposition, and the like. First and second magnetic layers 24 and 28 may comprise any number of magnetic materials, such as nickel (Ni), iron (Fe), cobalt (Co) or alloys thereof. Alternatively, first and second magnetic layers 24 and 28 may comprise a composite magnetic material, such as nickel-iron (NiFe), nickel-iron-cobalt (NiFeCo) or cobalt-iron (CoFe) or alloys thereof, for example. Additionally, first and second magnetic layers 24 and 26 may comprise other materials, such as platinum (Pt), iridium (Ir), manganese (Mn), aluminum (Al), ruthenium (Ru), osmium (Os) or tantalum (Ta) or combinations or alloys thereof. Tunnel barrier layer 26 preferably comprises aluminum oxide ($AlO_x$, where $0<x \leq 1.5$), but any number of insulators or semiconductors, such as aluminum nitride or oxides of nickel, iron, cobalt or alloys thereof, can be used in accordance with the present invention. First magnetic layer 24 serves as a hard magnetic layer, magnetization in which is pinned or fixed, whereas magnetization directions in second magnetic layer 28 are free to be switched between two magnetic states. Tunnel barrier layer 26 may be formed by the following methods. An aluminum film is deposited over first magnetic layer 24, then the aluminum film is oxidized by an oxidation source, such as RF oxygen plasma. As another method, aluminum is deposited together with oxide on first magnetic layer 24, and then oxidation is carried out in oxygen ambient either heated or unheated. First and second magnetic layers 24 and 28 have thicknesses in the range from approximately 5 to 500 angstroms. The thickness of tunnel barrier layer 26 ranges from about 5 to 30 angstroms.

In another exemplary embodiment of the invention, because first magnetic layer 24 typically comprises electrically conductive material, first magnetic layer 24 may be deposited overlying substrate 12 and may be in electrical contact with conductor 16.

After deposition of second magnetic layer 28, a second conductive layer 30 is deposited overlying second magnetic layer 28. Second conductive layer 30 may comprise any suitable electrically conductive materials. Preferably, second conductive layer 30 may comprise tantalum (Ta), aluminum (Al), tantalum nitride (TaN), titanium (Ti), titanium tungsten (TiW), titanium nitride (TiN) or any combinations or alloys thereof. More preferably, second conductive layer 30 is formed of tantalum.

A first masking layer 32 is deposited overlying second conductive layer 30 and is patterned using standard and well-known techniques so as to define the lateral dimensions of a magnetic tunnel junction (MTJ) element in the manner that will be described in greater detail below. Preferably, first masking layer 32 is made of a material, such as tetraethyl orthosilicate-derived silicon oxide (TEOS), plasma-enhanced nitride (PEN), silicon nitride (SiN), $SiO_2$, diamond-like carbon and the like.

Second conductive layer 30 then is etched such that its lateral dimensions correspond to the lateral dimensions of patterned first masking layer 32, as illustrated in FIG. 1. Second conductive layer 30 may be etched using a dry etch, an ion milling process or reactive ion etching (RIE).

Figure 2:
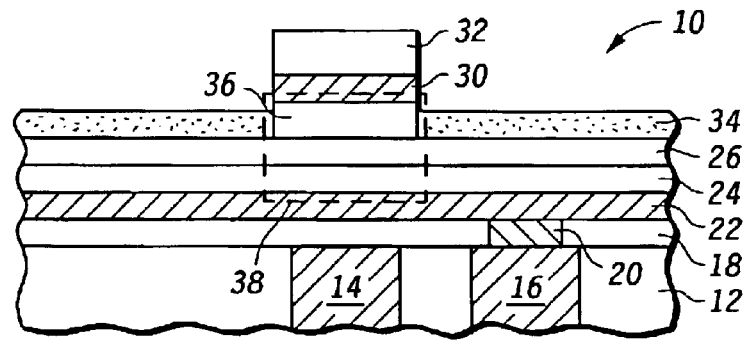

Referring to FIG. 2, second magnetic layer 28 may be partially etched using a dry etch and the remaining exposed portion of second magnetic layer 28 is changed into a material containing dielectric properties utilizing either oxidation or nitridation techniques. More specifically, the exposed portion of second magnetic layer 28 is transformed into an insulative portion 34 to isolate the second magnetic layer that isolates an active portion 36. During the process of transforming the exposed portion of second magnetic layer 28 into an insulative portion 34, first masking layer 32 protects the unexposed portion of second magnetic layer 28 so that, after the oxidation or nitridation takes place, an active portion 36 is defined, which remains metallic, and an inactive portion, or dielectric insulator 34 is defined where the now-insulative portion is located. Additional information regarding the oxidation and nitridation of magnetic materials to form insulative materials can be found in U.S. Pat. No. 6,265,803, entitled "Magnetic Random Access Memory and Fabrication Method Thereof;" issued Dec. 26, 2000, and incorporated in its entirety herein by reference. The lateral dimensions of the active portion 36 correspond to the lateral dimensions of the concurrently formed MTJ element 38, which comprises active portion 36, tunnel barrier layer 26 and first magnetic layer 24.

In an alternative exemplary embodiment of the invention, the exposed portion of second magnetic layer 28 may be transformed as described above without the partial etching of second magnetic layer 28 if second magnetic layer 28 is sufficiently thin so that the exposed portion of second magnetic layer 28 is rendered insulative upon oxidation or nitridation.

Figure 3:
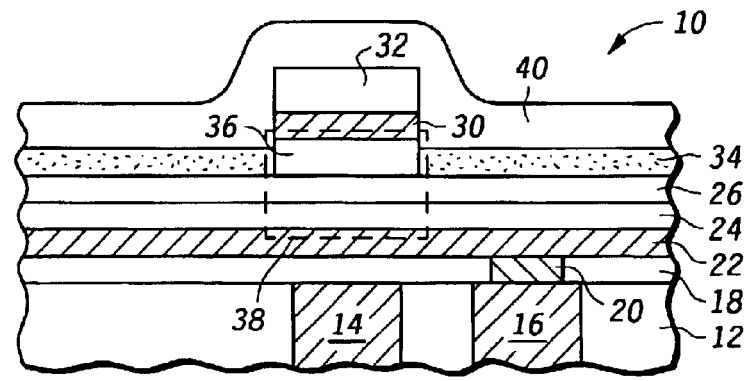
Figure 4:
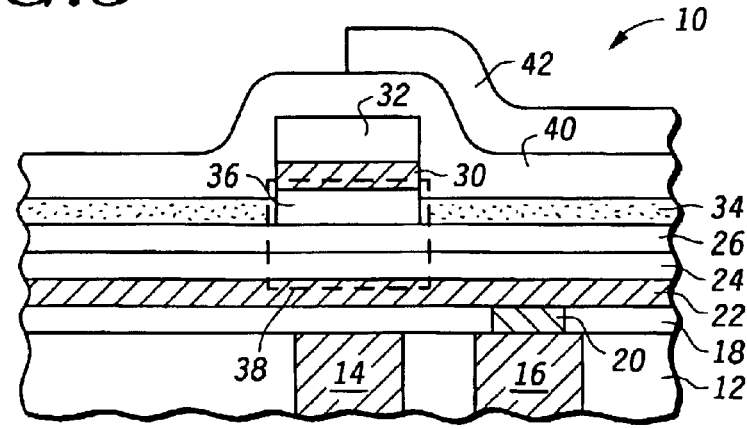
Figure 5:
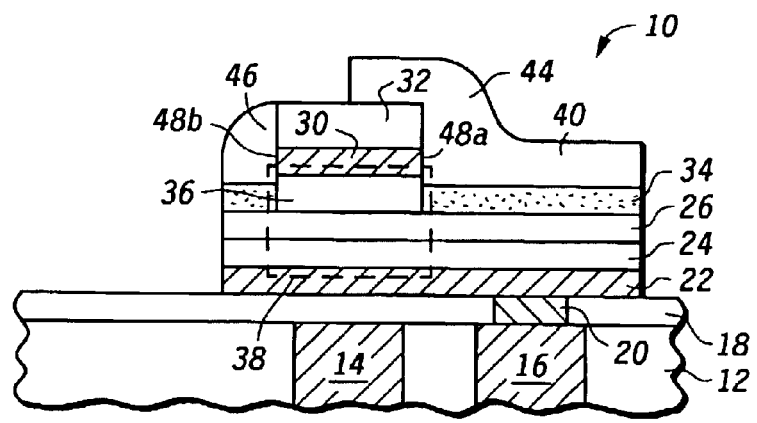

Referring to FIGS. 3–5, a blanket second masking layer 40 is deposited globally overlying magnetic memory element structure 10. Preferably, second masking layer 40 is formed of a hardmask such as that formed from TEOS, PEN, silicon dioxide, silicon nitride, or any other suitable dielectric material. A photoresist layer 42 may be formed and developed overlying second masking layer 40 using standard photolithography techniques. Second masking layer 40 then may be etched, preferably using a dry etch. Etching of second masking layer 40 forms a masking tab 44 that overlies a portion of MTJ element 38, is positioned adjacent a first portion 48a of a plurality of sidewalls or outer lateral edges of second conductive layer 30, and overlies an area of inactive insulative portion 34, thus extending from MTJ element 38 laterally to at least a portion of conducting via 20 and overlying at least a portion of conducting via 20. Second masking layer 40 is also etched to form a sidewall spacer 46 that is positioned so as to cover a second portion 48b of the plurality of sidewalls or outer lateral edges of second conductive layer 30. It will be appreciated that, depending on the cross-sectional shape of second conductive layer 30, second conductive layer 30 may have a plurality of contiguous flat or curved outer lateral edges or sidewalls or may have one continuous annular sidewall. As used herein, the term "plurality of outer lateral edges" is to be understood to cover a plurality of contiguous flat or curved lateral edges joined together or one continuous annular sidewall. Sidewall spacer 46 can have any thickness suitable for a desired application. After second masking layer 40 is etched, the remaining exposed areas of inactive insulative portion 34, tunnel barrier 26, first magnetic layer 24 and first conductive layer 22, that is, those areas of layers 34, 26, 24 and 22 not underlying masking tab 44 or sidewall spacer 46, may be etched, preferably using a dry etch or ion milling process. The lateral edges of layers 34, 26, 24 and 22 are defined by the lateral edges of sidewall spacer 46 and masking tab 44.

Figure 6:
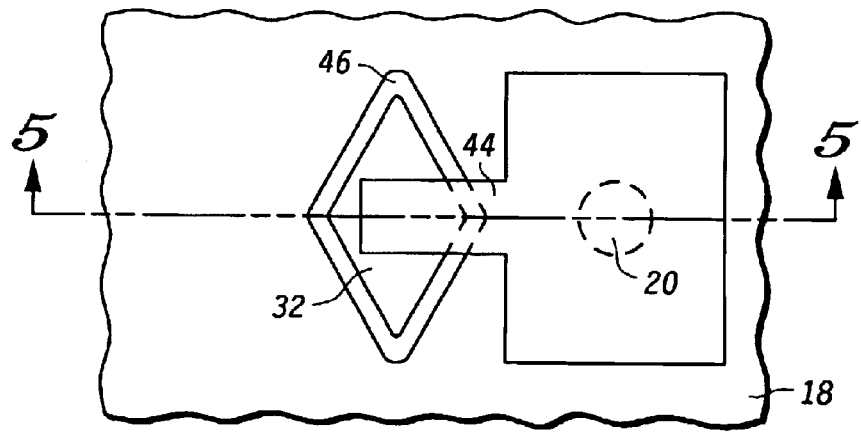
FIG. 6 is a top view of the magnetic memory element structure of FIG. 5.

FIG. 6 is a top view of the magnetic memory element structure 10 of FIG. 5 with sidewall spacer 46 and with masking tab 44 formed overlying a portion of MTJ element 38 and extending to at least a portion of conducting via 20. As illustrated in FIGS. 5 and 6, the lateral edges of sidewall spacer 46 and masking tab 44 define an electrical connection from MTJ element 38 through first conductive layer 22 to conducting via 20. In addition, sidewall spacer 46 and masking tab 44 reduce the likelihood of an electrical shorting of MTJ element 38 by preventing the deposition of metallic particles, and the formation of a resulting electrical connection, between the metallic layers of MTJ element 38 during etching of the metallic layers of magnetic memory element structure 10. Moreover, sidewall spacer 46 and masking tab 44 are fabricated with a thickness or area that reduces the overall area requirement of the magnetic memory element structure 10. Accordingly, the density of such structures in MRAM device arrays may be increased.

Figure 7:
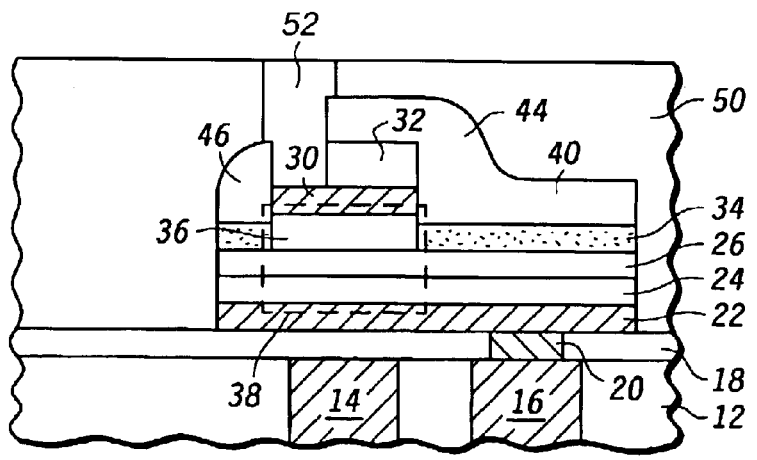
FIG. 7 illustrates schematically, in cross section, a method for fabricating a magnetic memory element structure in accordance with another exemplary embodiment of the present invention.

Referring to FIG. 7, in another exemplary embodiment of the present invention, the sidewall spacer 46 and masking tab 44 may be utilized to form a self-aligned via to second conductive layer 30. A blanket second dielectric layer 50 may be deposited globally overlying magnetic memory element structure 10 and planarized using techniques such as chemical mechanical polishing (CMP). In this embodiment of the invention, second masking layer 40 is formed from a material different from the material(s) that form second dielectric layer 50 and first masking layer 32 such that sidewall spacer 46 and masking tab 44 etch at a slower rate than second dielectric layer 50 and first masking layer 32 when the layers are subjected to an etching chemistry. For example, first masking layer 32 and second dielectric layer 50 may be made from TEOS and sidewall spacer 46 and masking tab 44 may comprise silicon nitride. A photoresist layer (not shown) may be formed and developed overlying second dielectric layer 50 using standard photolithography techniques. A via 52 then may be etched using standard and well-known etching processes to second conductive layer 30. If there is any misalignment of via 52, etching is stopped by sidewall spacer 46 and masking tab 44. In this way, the likelihood of a physical metallic connection across tunnel barrier layer 24 at the lateral edges of MTJ element 38 and thus an electrical shorting of MTJ element 38 is reduced.

Figure 8:
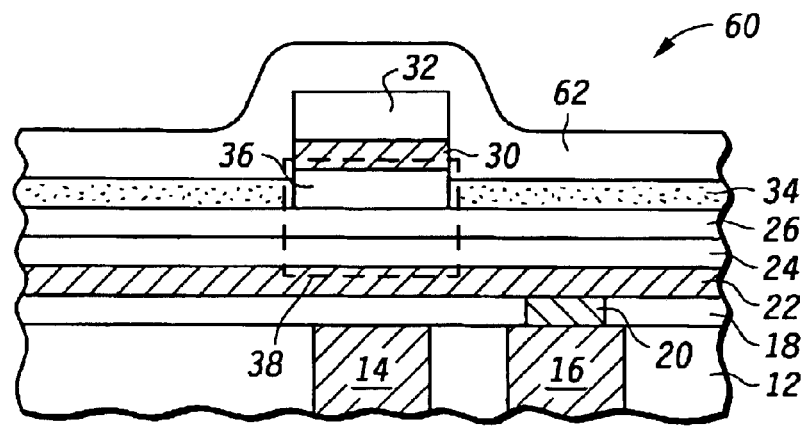
FIGS. 8–12 illustrate schematically, in cross section, a method for fabricating a magnetic memory element structure in accordance with a further exemplary embodiment of the present invention.

FIGS. 8–12 illustrate a method in accordance with another exemplary embodiment of the present invention for fabricating a magnetic memory element structure of an MRAM device. Elements of FIGS. 8–12 that have the same reference numbers as FIGS. 1–2 are the same as the corresponding FIGS. 1–2 elements. FIG. 8 is a cross-sectional view of partially fabricated magnetic memory element structure 60 of an MRAM device. The method begins with steps corresponding to the steps described above with reference to FIGS. 1 and 2. After transformation of second magnetic layer 28 to inactive insulative portion 34 and active portion 36, a blanket second masking layer 62 is deposited globally overlying magnetic memory element structure 60. Preferably, second masking layer 62 is formed of a hardmask such as that formed from TEOS, PEN, silicon dioxide, silicon nitride, or any other suitable dielectric material. In one exemplary embodiment of the invention, second masking layer 62 is formed of the same material that forms first masking layer 32 or is formed of a material that has the same etch rate as the material of first masking layer 32 when both layers are subjected to an etching chemistry. In another exemplary embodiment of the invention, second masking layer 62 is formed of a material that is different from the material that forms first masking layer 32 such that the material of second masking layer 62 etches at a slower rate than first masking layer 32 when both layers are subjected to an etching chemistry.

Figure 9:
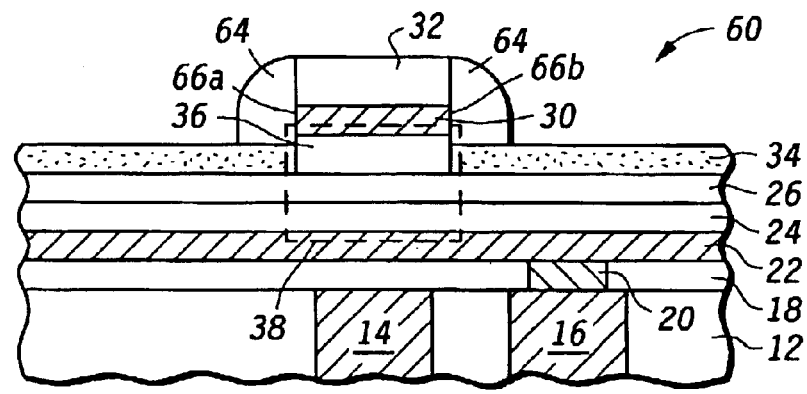

Referring to FIG. 9, second masking layer 62 then may be etched, preferably using a dry etch, to form a sidewall spacer 64 that is positioned so as to cover a plurality of outer lateral edges 66a and 66b of second conductive layer 30. Sidewall spacer 64 can have any thickness suitable for a desired application.

Figure 10:
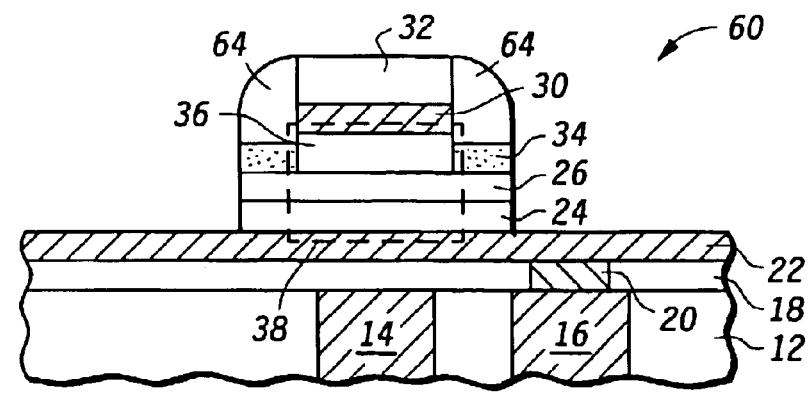

After formation of sidewall spacer 64, inactive insulative portion 34 and tunnel barrier 26 may be etched, preferably using a dry etch or ion milling process. In an alternative embodiment of the invention, as illustrated in FIG. 10, inactive insulative portion 34, tunnel barrier 26 and first magnetic layer 24 may be etched. The lateral edges of layers 34 and 26 (and 24) are defined by the lateral edges of sidewall spacer 64.

Figure 11:
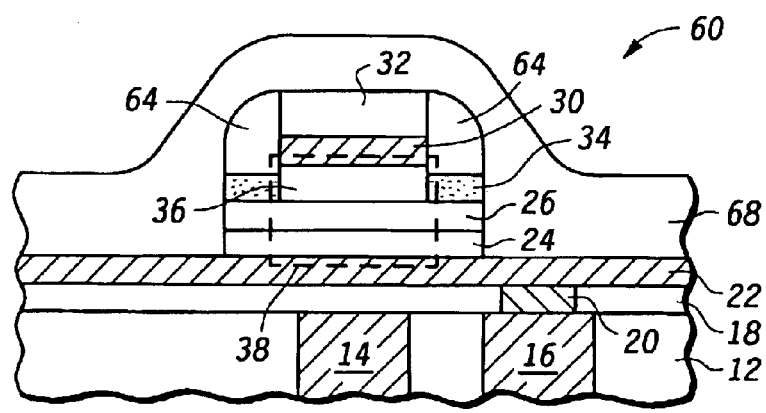

Referring to FIG. 11, a third masking layer 68 is deposited globally overlying magnetic memory element structure 60. Preferably, third masking layer 68 is formed of a hardmask such as that formed from TEOS, PEN, silicon dioxide, silicon nitride, or any other suitable dielectric material. In one exemplary embodiment of the invention, first masking layer 32 and third masking layer 68 may be formed of the same material. In another exemplary embodiment of the invention, first masking layer 32 and third masking layer 68 may be formed of different materials such that, when subjected to an etching chemistry, third masking layer 68 etches at a slower rate than first masking layer 32. A photoresist layer (not shown) may be formed and developed overlying third masking layer 68 using standard photolithography techniques.

Figure 12:
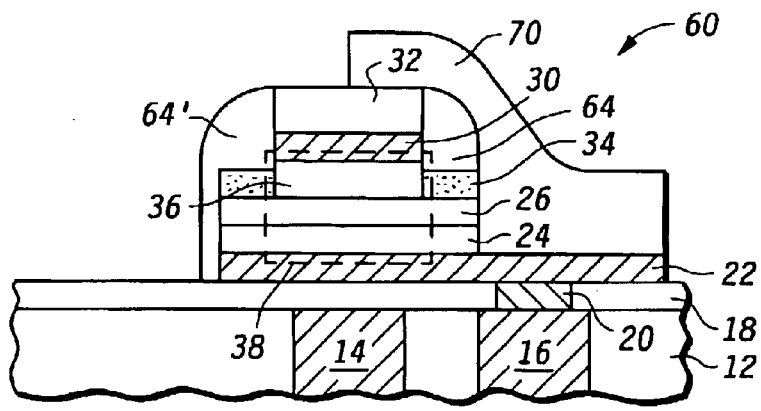

Referring to FIG. 12, third masking layer 68 then may be etched, preferably using a dry etch, to form a masking tab 70 that overlies a portion of MTJ element 38, is positioned adjacent a portion 72 of sidewall spacer 64, and overlies first conductive layer 22 (or, alternatively, first conductive layer 22 and first magnetic layer 24), thus extending from MTJ element 38 to conducting via 20 and overlying at least a portion of conducting via 20. Note that a now exposed sidewall spacer 64', which is external to the area under masking tab 70, will be wider than sidewall spacer 64 because exposed sidewall spacer 64' is composed of sidewall spacer 64 and additionally comprises residual material of third masking layer 68 which remains after the etch of masking tab 70. After third masking layer 68 is etched, first conductive layer 22 (or, alternatively, first conductive layer 22 and first magnetic layer 24) may be etched, preferably using a dry etch or ion milling process. The lateral edges of first conductive layer 22 (or, alternatively, first conductive layer 22 and first magnetic layer 24) are defined by the lateral edges of masking tab 70 and that portion of sidewall 64 not underlying masking tab 70.

Figure 13:
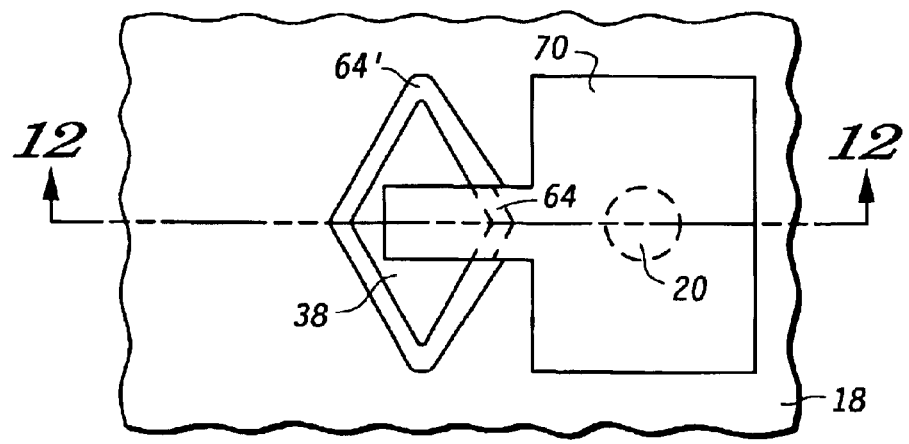
FIG. 13 is a top view of the magnetic memory element structure of FIG. 12.

FIG. 13 is a top view of magnetic memory element structure 60 of FIG. 12. Sidewall spacers 64 and 64' surround second conductive layer 30 (not shown), which underlies first masking layer 32. First masking layer 32 defines the lateral dimensions of MTJ element 38 (not shown) that underlies second conductive layer 30. Masking tab 70 overlies a portion of first masking layer 32 and, hence, MTJ element 38 and extends to at least a portion of conducting via 20. As illustrated in FIGS. 11–13, and as explained above, the lateral edges of sidewall spacer 64 and masking tab 70 define an electrical connection from MTJ element 38 through first conductive layer 22 to conducting via 20. In addition, sidewall spacers 64 and 64' and masking tab 70 reduce the likelihood of an electrical shorting of MTJ element 38 by preventing the deposition of metallic particles, and the formation of a resulting electrical connection, between the metallic layers of MTJ element 38 during etching of the metallic layers of magnetic memory element structure 60. Moreover, sidewall spacers 64 and 64' and masking tab 70 are fabricated with a thickness or area that reduces the overall area requirement of the magnetic memory element structure 60. Accordingly, the density of such structures in MRAM device arrays may be improved.

Figure 14:
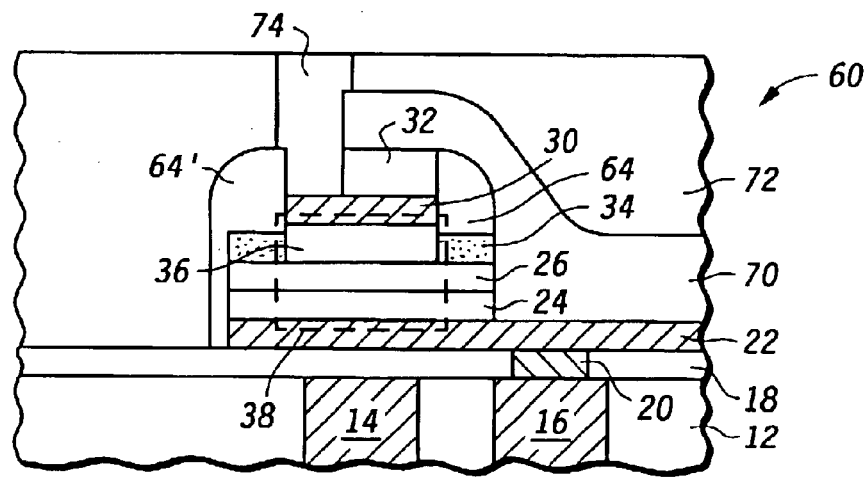
FIG. 14 illustrates schematically, in cross section, a method for fabricating a magnetic memory element structure in accordance with another exemplary embodiment of the present invention.

Referring to FIG. 14, in another exemplary embodiment of the present invention, sidewall spacer 64' may be utilized to form a via to second conductive layer 30. A blanket second dielectric layer 72 may be deposited globally overlying magnetic memory element structure 60 and planarized using techniques such as CMP. In this embodiment of the invention, sidewall spacer 64' is formed from a material different from the material(s) that form second dielectric layer 72 and first masking layer 32 such that sidewall spacer 64' etches at a slower rate than second dielectric layer 72 and first masking layer 32 when these layers are subjected to an etch chemistry. For example, first masking layer 32 and second dielectric layer 72 may comprise PEN and sidewall spacer 64' may comprise silicon oxide. A photoresist layer (not shown) may be formed and developed overlying second dielectric layer 72 using standard lithography techniques. A via 74 then may be etched using standard and well-known etching processes to second conductive layer 30. If there is any misalignment of via 74, etching is stopped by sidewall spacer 64'. In this way, the likelihood of a physical metallic connection across tunnel barrier layer 24 at the lateral edges of MTJ element 38 and thus an electrical shorting of MTJ element 38 is reduced.

In another exemplary embodiment of the invention, masking tab 70 could be formed of a material different from the material(s) that form second dielectric layer 72 and first masking layer 32 such that masking tab 70 etches at a slower rate than second dielectric layer 72 and first masking layer 32 when these layers are subjected to an etch chemistry. Accordingly, if there is any misalignment of via 74, etching is stopped by sidewall spacer 64' and masking tab 70.

Figure 15:
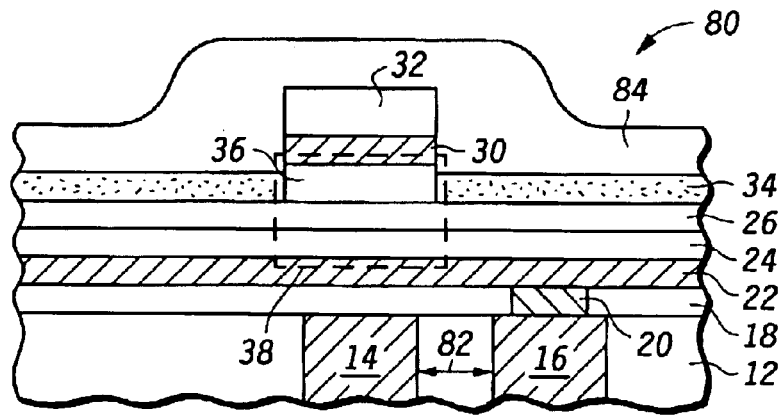
FIGS. 15–17 illustrate schematically, in cross section, a method for fabricating a magnetic memory element structure in accordance with a further exemplary embodiment of the present invention.
Figure 16:
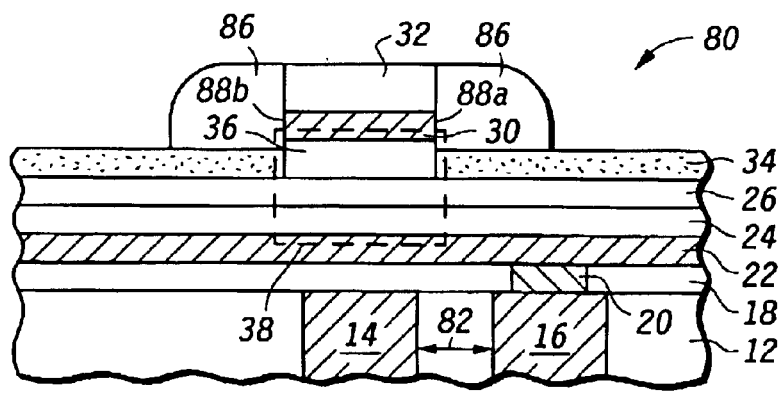
Figure 17:
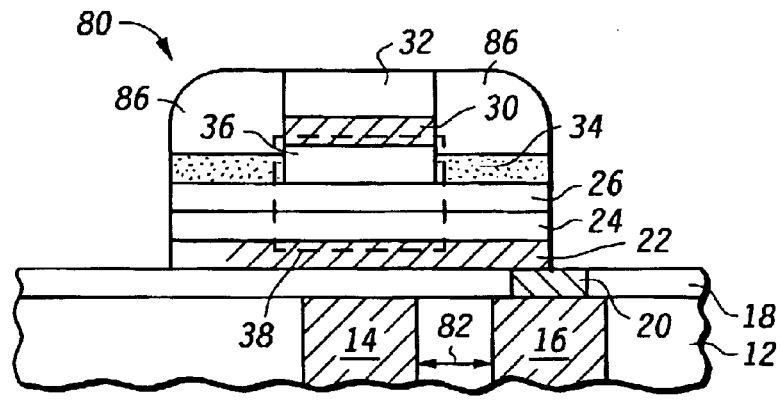

FIGS. 15–17 illustrate a method in accordance with a further exemplary embodiment of the present invention for fabricating a magnetic memory element structure of an MRAM device. Elements of FIGS. 15–17 that have the same reference numbers as FIGS. 1–2 are the same as the corresponding FIGS. 1–2 elements. FIG. 15 is a cross-sectional view of partially fabricated magnetic memory element structure 80 of an MRAM device. The method begins with steps corresponding to the steps described above with reference to FIGS. 1 and 2. As described above with reference to FIGS. 1 and 2, during the formation of digit line 14, digit line 14 is positioned within substrate 12 so as to be magnetically coupled to MTJ element 38. Typically, magnetically coupling of MTJ element 38 and digit line 14 is realized when digit line 14 approximately underlies MTJ element 38. Also during formation of digit line 14 and conductor 16, digit line 14 and conductor 16 are formed with a distance 82 therebetween.

After transformation of second magnetic layer 28 to inactive insulative portion 34 and active portion 36, a blanket second masking layer 84 may be deposited globally overlying magnetic memory element structure 80. Preferably, second masking layer 84 is formed of a hardmask such as that formed from TEOS, PEN, silicon dioxide, silicon nitride, or any other suitable dielectric material. In one exemplary embodiment of the invention, second masking layer 84 is formed of the same material that forms first masking layer 32 or is formed of a material that has the same etch rate as the material of first masking layer 32 when both layers are subjected to an etching chemistry. In another exemplary embodiment of the invention, second masking layer 84 is formed of a material different from the material that forms first masking layer 32 such that the material of second masking layer 84 etches at a slower rate than first masking layer 32 when both layers are subjected to an etching chemistry.

Referring to FIG. 16, second masking layer 84 may be etched, preferably using a dry etch, to form a sidewall spacer 86 that is positioned so as to cover the plurality of outer lateral edges 88a and 88b of second conductive layer 30. Sidewall spacer 86 preferably is patterned to overlie at least a portion of conducting via 20.

Referring to FIG. 17, after formation of sidewall spacer 86, inactive insulative portion 34, tunnel barrier 26, first magnetic layer 24 and first conductive layer 22 may be etched, preferably using a dry etch or ion milling process. As the lateral edges of layers 34, 26, 24 and 22 are defined by the lateral edges of sidewall spacer 86, the lateral edges of layers 34, 26, 24 and 22 overlie at least a portion of conducting via 20. Accordingly, sidewall spacer 86 can be used to reduce or eliminate the likelihood that first conductive layer 22 will be etched so that electrical contact with conducting via 20, and hence conductor 16, is terminated. Further, in another exemplary embodiment of the invention, by fabricating conductor 16 and digit line 14 with a suitably narrow distance 82 therebetween, the density of magnetic memory element structures 80 in an MRAM device may be maximized.

Figure 18:
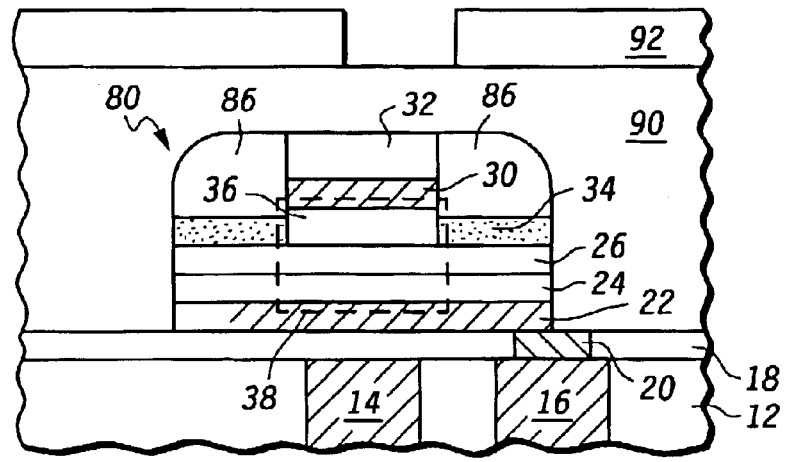
FIGS. 18–19 illustrate schematically, in cross section, a method for fabricating a magnetic memory element structure in accordance with another exemplary embodiment of the present invention.

Referring to FIG. 18, in another exemplary embodiment of the present invention, sidewall spacer 86 may be utilized to increase the permissible tolerances used when etching vias to second conductive layer 30. A blanket second dielectric layer 90 may be deposited globally overlying magnetic memory element structure 80 and planarized using techniques such as CMP. In this embodiment of the invention, sidewall spacer 86 is formed from a material that is different from the material(s) that form second dielectric layer 90 and first masking layer 32 so that sidewall spacer 86 etches at a slower rate than second dielectric layer 90 and first masking layer 32. For example, first masking layer 32 and second dielectric layer 90 may be made from TEOS and sidewall spacer 86 may comprise silicon nitride. A photoresist layer 92 may be formed and developed overlying second dielectric layer 90 using standard photolithography techniques.

Figure 19:
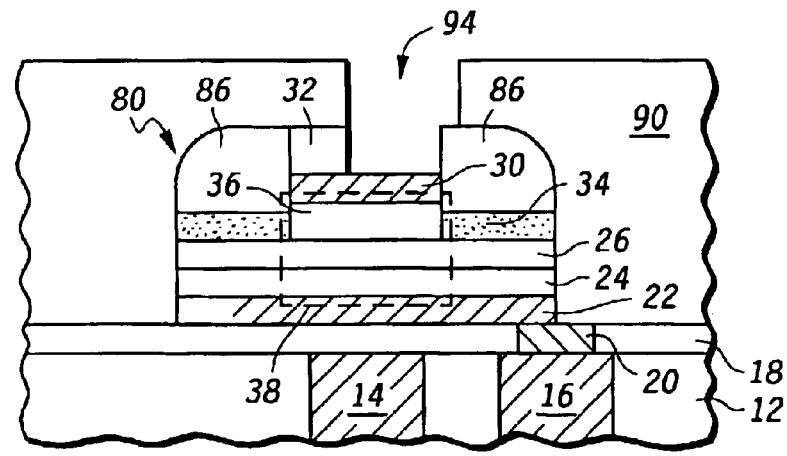

Referring to FIG. 19, a via 94 then may be etched using standard and well-known etching processes to second conductive layer 30. If there is any misalignment of via 94, etching is stopped by sidewall spacer 86.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating a magnetic memory element structure, the method comprising the steps of:
   providing a dielectric layer having a conducting via formed therein;
   forming a first magnetic layer overlying said dielectric layer and in electrical communication with said conducting via;
   forming a tunnel barrier layer overlying said first magnetic layer;
   forming a second magnetic layer overlying said tunnel barrier layer,
   depositing a first conductive layer overlying said second magnetic layer;
   depositing a first masking layer overlying said first conductive layer and patterning said first masking layer;
   using said patterned first masking layer, etching said first conductive layer, said etching causing said first conductive layer to have a plurality of sidewalls, said etching further exposing a portion of said second magnetic layer;
   transforming said exposed portion of said second magnetic layer to form an insulative inactive portion and an active portion of said second magnetic layer, said active portion comprising a portion of a magnetic tunnel junction element and said insulative inactive portion comprising an insulator;
   forming a sidewall spacer adjacent at least one of said plurality of sidewalls of said first conductive layer, and
   forming a masking tab that overlies a portion of said patterned first masking layer and a portion of said magnetic tunnel junction element and that laterally extends from said magnetic tunnel junction element to said conducting via and overlies at least a portion of said conducting via.

2. The method of claim 1, further comprising the step of depositing a second conductive layer overlying said dielectric layer and electrically coupled to said conducting via before said step of forming a first magnetic layer.

3. The method of claim 1, further comprising etching said first masking layer to form a via to said first conductive layer.

4. The method of claim 3, wherein said masking tab and said sidewall spacer are formed of a first material and said first masking layer is formed of a second material different from said first material and wherein said step of etching said first masking layer comprises subjecting said first masking layer, said sidewall spacer and said masking tab to an etching chemistry such that said second material etches faster than said first material.

5. The method of claim 3, wherein said step of etching said first masking layer comprises subjecting said first masking layer, said sidewall spacer and said masking tab to an etching chemistry such that said first masking layer etches faster than said sidewall spacer and said masking tab.

6. The method of claim 1, wherein said step of forming a sidewall spacer and said step of forming a masking tab comprises depositing a second masking layer overlying said insulative inactive portion, adjacent said plurality of sidewalls of said first conductive layer and overlying said first masking layer and etching said second masking layer to form said sidewall spacer and said masking tab.

7. The method of claim 6, said step of etching said second masking layer comprising exposing a portion of said insulative inactive portion, said tunnel barrier layer, and said first magnetic layer and said method further comprising etching said exposed portion of said insulative inactive portion, said tunnel barrier layer and said first magnetic layer.

8. The method of claim 1, wherein said step of transforming comprises partially etching said exposed portion of said second magnetic layer.

9. The method of claim 1, wherein said step of transforming comprises subjecting said exposed portion of said second magnetic layer to oxidation or nitridation.

10. The method of claim 1, wherein said sidewall spacer and said masking tab are formed of the same material.

11. The method of claim 1, wherein maid step of forming a sidewall spacer comprises depositing a second masking layer overlying said insulative inactive portion, adjacent said plurality of sidewalls of said first conductive layer, said overlying said first masking layer and etching said second masking layer to form said sidewall spacer, said etching said second masking layer exposing a portion of said insulative inactive portion, said tunnel barrier layer and said first magnetic layer.

12. The method of claim 11, further comprising etching said exposed portion of said insulative inactive portion and said tunnel barrier layer.

13. The method of claim 11, further comprising etching said exposed portion of said insulative inactive portion, said tunnel barrier layer and said first magnetic layer.

14. The method of claim 12, wherein said step of forming a masking tab comprises depositing a third masking layer overlying said substrate, said sidewall spacer and said first masking layer and etching said third masking layer to form said masking tab.

15. A method for fabricating a magnetic memory element structure, the method comprising the steps of:
   providing a dielectric layer having a conducting via formed therein;
   forming a first magnetic layer overlying said dielectric layer and in electrical communication with said conducting via;
   forming a tunnel barrier layer overlying said first magnetic layer;
   forming a second magnetic layer overlying said tunnel barrier layer;
   depositing a first conductive layer overlying said second magnetic layer
   patterning said first conductive layer, said patterning exposing a portion of said second magnetic layer;
   transforming said exposed portion of said second magnetic layer to form an insulative inactive portion and an active portion of said active portion comprising a portion of a magnetic tunnel junction element and said insulative inactive portion comprising an insulator;
   forming a sidewall spacer about said first conductive layer; and
   using said sidewall spacer as a mask etching said insulative inactive portion, said tunnel barrier layer and said first magnetic layer;

wherein said sidewall spacer has a lateral dimension such that upon etching of said insulative inactive portion, said tunnel barrier layer, and said first magnetic layer, said magnetic tunnel junction element is electrically coupled to said conducting via.

16. The method of claim 15, further comprising the step of depositing a second conductive layer overlying said dielectric layer and electrically coupled to said conducting via before said step of forming a first magnetic layer.

17. The method of claim 15, said step of patterning said first conductive layer comprising:
depositing a first masking layer overlying said first conductive layer and patterning said first masking layer;
etching said first conductive layer, said etching exposing a portion of said second magnetic layer.

18. The method of claim 17, further comprising the step of etching said first masking layer to form a via to said first conductive layer.

19. The method of claim 18, wherein said sidewall spacer is formed of a first material and said first masking layer is formed of second material different from said first material and wherein said step of etching said first masking layer comprises subjecting said first masking layer and said sidewall spacer to an etching chemistry such that said second material etches faster than said first material.

20. The method of claim 15, wherein said step of transforming comprises partially etching said exposed portion of said second magnetic layer.

21. The method of claim 15, wherein said step of transforming comprises subjecting said exposed portion of said second magnetic layer to oxidation or nitridation.

22. A method for fabricating a magnetic memory element structure, the method comprising the steps of:
providing a dielectric layer having a conducting via formed therein;
forming a first magnetic layer overlying said dielectric layer and electrically coupled to said conducting via;
forming a tunnel barrier layer overlying said first magnetic layer;
forming a second magnetic layer overlying said tunnel barrier layer;
depositing a first conductive layer overlying said second magnetic layer;
depositing a masking layer overlying said first conductive layer and patterning said masking layer;
etching said first conductive layer, said etching exposing a portion of said second magnetic layer;
transforming said exposed portion of said second magnetic layer to form an insulative inactive portion and an active portion of said second magnetic layer, said active portion comprising a portion of a magnetic tunnel junction element and said insulative inactive portion defining an insulator;
forming a sidewall spacer about said first conductive layer, said sidewall spacer formed of a first material;
depositing a dielectric material layer overlying said sidewall spacer and said first masking layer, said dielectric material layer formed of a second material different from said first material; and
forming a via to said first conductive layer using an etching process that causes said dielectric material layer to etch faster than said sidewall spacer.

23. The method of claim 22, said stop of depositing a masking layer comprising depositing a masking layer formed of a third material different than said first material wherein said step of forming a via comprises using an etching process that causes said masking layer to etch faster than said sidewall spacer.

24. A method for fabricating a magnetic memory element structure, the method comprising the steps of;
providing a substrate having a conductor and a digit line formed therein;
depositing a first conductive layer overlying said substrate, said first conductive layer in electrical communication with said conductor;
forming a memory element overlying said first conductive layer and in electrical contact with said first conductive layer, said memory element magnetically coupled to said digit line and having an active free magnetic layer;
forming a second conductive layer overlying said memory element;
isolating said active free magnetic layer;
forming a sidewall spacer about at least a portion of said second conductive layer and forming a masking tab that overlies a portion of said memory element wherein said sidewall spacer and said masking tab are formed simultaneously from a masking layer; and
patterning said masking tab such that, when said first conductive layer is subsequently patterned, said first conductive layer electrically connects said memory element and said conductor.

25. The method of claim 24, wherein said step of forming a memory element comprises:
forming a first magnetic layer overlying said first conductive layer;
forming a tunnel barrier layer overlying said first magnetic layer, and
forming a second magnetic layer overlying said tunnel barrier layer.

26. The method of claim 25, wherein said step of forming a second conductive layer comprises:
depositing a second conductive layer overlying said second magnetic layer;
depositing a masking layer overlying said second conductive layer and patterning said masking layer; and
etching said second conductive layer, said etching exposing a portion of said second magnetic layer.

27. The method of claim 26, wherein said step of isolating comprises transforming said exposed portion of said second magnetic layer to form an insulative inactive portion and said active free magnetic layer of said second magnetic layer.

* * * * *

UNITED STATES PATENT AND TRADEMARK OFFICE
CERTIFICATE OF CORRECTION

| | | |
|---|---|---|
| PATENT NO. | : 6,911,156 B2 | Page 1 of 1 |
| APPLICATION NO. | : 10/417537 | |
| DATED | : April 16, 2003 | |
| INVENTOR(S) | : Gregory W. Grynkewich | |

It is certified that error appears in the above-identified patent and that said Letters Patent is hereby corrected as shown below:

In Column 10, Line 22, Claim No. 11:

Change "wherein maid" to --wherein said--

In Column 10, Line 54, Claim No. 15:

Change "magnetic layer" to --magnetic layer;--

In Column 10, Line 59, Claim No. 15:

Change "active portion of said active portion" to --active portion of said second magnetic layer of said active portion--

Signed and Sealed this

Thirteenth Day of May, 2008

JON W. DUDAS
*Director of the United States Patent and Trademark Office*

UNITED STATES PATENT AND TRADEMARK OFFICE
CERTIFICATE OF CORRECTION

PATENT NO.       : 6,911,156 B2
APPLICATION NO.  : 10/417537
DATED            : June 28, 2005
INVENTOR(S)      : Gregory W. Grynkewich It is certified that error appears in the above-identified patent and that said Letters Patent is hereby corrected as shown below:

In Column 10, Line 22, Claim No. 11:

Change "wherein maid" to --wherein said--

In Column 10, Line 54, Claim No. 15:

Change "magnetic layer" to --magnetic layer;--

In Column 10, Line 59, Claim No. 15:

Change "active portion of said active portion" to --active portion of said second magnetic layer of said active portion--

This certificate supersedes the Certificate of Correction issued May 13, 2008.

Signed and Sealed this

Third Day of June, 2008

JON W. DUDAS
*Director of the United States Patent and Trademark Office*